United States Patent [19]
Theogarajan

[11] Patent Number: 6,046,608
[45] Date of Patent: Apr. 4, 2000

[54] DIFFERENTIAL PRECHARGE CIRCUIT

[75] Inventor: Luke Theogarajan, Beaverton, Oreg.

[73] Assignee: Intel Corporation, Santa Clara, Calif.

[21] Appl. No.: 08/987,100

[22] Filed: Dec. 8, 1997

[51] Int. Cl.[7] .............................................. H03K 19/0948
[52] U.S. Cl. .......................................... 326/121; 326/112
[58] Field of Search ............................. 326/83, 112, 115, 326/119, 121

[56] References Cited

U.S. PATENT DOCUMENTS

| | | | |
|---|---|---|---|
| 4,602,167 | 7/1986 | Yukawa | 326/119 |
| 5,444,396 | 8/1995 | Soneda | 326/121 |
| 5,455,528 | 10/1995 | Partovi et al. | 326/119 |

Primary Examiner—Michael Tokar
Assistant Examiner—Don Phu Le
Attorney, Agent, or Firm—Blakely, Sokoloff, Taylor & Zafman LLP

[57] ABSTRACT

A fast-switching differential precharge circuit is described. This circuit includes a precharging device for placing a first or a second node in a first desired state by providing a connection between that node and a first voltage supply. A second precharging device is also included, which places a second node in a second desired state, which is the logical inverse of the first desired state. Each precharging device includes a state maintaining device and a resetting device. The differential precharge circuit also includes first and second logical networks that are connected to both the first and second nodes and help to maintain the state of a given node. A method for differentially precharging a circuit is also described. The method includes applying a first state to a first node and applying a second state to a second node, such that the second state is the logical inverse of the first state. The second state on the second node is maintained, while a logic device coupled to the first node is reset. This enables the first node to be quickly charged to the second state and maintained in that state during the next input data transition, if so dictated.

25 Claims, 11 Drawing Sheets

DIFFERENTIAL PRECHARGE CIRCUIT

BACKGROUND OF THE INVENTION

1. Field of the Invention

The invention relates in general to logic devices, and more particularly to a fast-switching differential precharge circuit.

2. Description of the Related Art

With the growing complexity of modem computer systems, designers are constantly seeking more efficient methods to reduce power and cost, while increasing speed. Generally, the major components in a computer system are formed from the combination of millions of logic gates. Typically, the power, cost, and speed of the components correlate to the operational efficiency of these logic gates. The switching speed of a logic gate is generally defined in the art as the time that it takes for the output terminal to reflect a change at the input terminal. By significantly improving the performance of the logic gate, the overall performance of the computer system can be improved.

Figure 1:
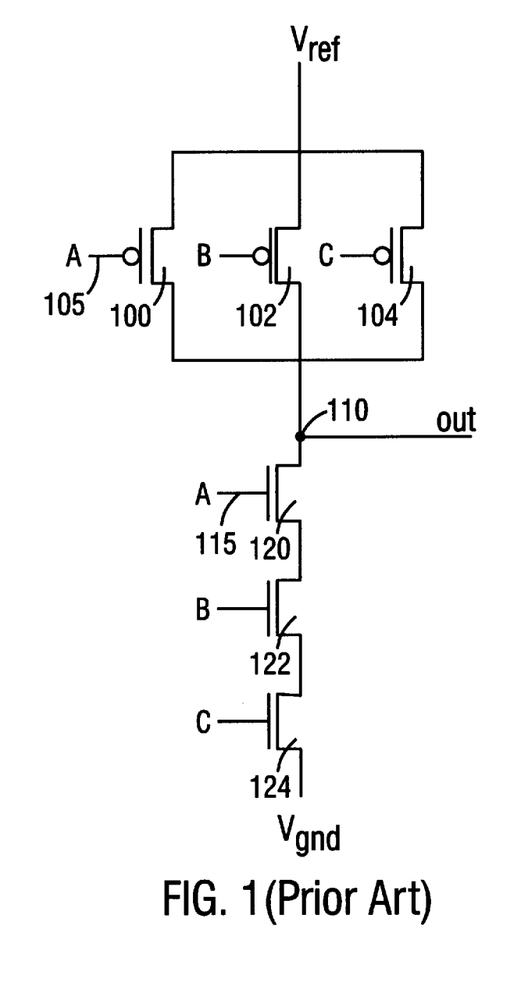
FIG. 1 is a circuit diagram for a conventional static ram logic circuit.

FIG. 1 illustrates six MOS (metal oxide semiconductor) transistors 100, 102, 104, 120, 122, 124 connected to form a conventional static CMOS (complementary MOS) logic gate. The transistors essentially function as switches. These switches are normally open, which prevents current from flowing (i.e., charge from redistributing) and corresponds to the transistor being "off." Transistors can be turned "on" by applying a voltage to an enable input terminal. NMOS transistors are turned "on" when a logically high voltage level is applied to the enable input terminal, while PMOS transistors are turned "on" when a logically low voltage level is applied to the enable input terminal. A logically high voltage level, as defined in this application, is a voltage level that is approximately equal to a reference voltage, while a logically low voltage level is approximately equal to a ground voltage. When a node has a logically high voltage level applied, it is designated as being in a logically "high" state. A node is designated as being in a logically "low" state when a logically low voltage level is applied to the node.

The transistor 100 is a PMOS transistor with an enable input terminal 105 referred to as an input terminal A. When a logically low voltage level is applied to the input terminal A, the transistor 100 turns "on," connecting a reference voltage level $V_{ref}$ to an output node 110, forcing the output node 110 to a logically "high" state. At approximately the same time, the logically low voltage level at the input terminal A is also applied to an enable input terminal 115 of the is NMOS transistor 120. Thus, the NMOS transistor 120 does not turn "on." One skilled in the art will appreciate that when the input terminals A, B, and C are "high," all of the PMOS transistors 100, 102, 104 in FIG. 1 will be "off," while all of the NMOS transistors 120, 122, 124 will be "on." When any of the input terminals A, B, or C are "low," a logically high voltage level approximately equal to the reference voltage $V_{ref}$ is present at the output node 110. Similarly, when all of the input terminals A, B, and C are "high," the output node 110 is connected to ground through the transistors 120, 122, 124, and a logically low voltage level is present at the output node 110. The circuit shown in FIG. 1 is configured to implement a logical NAND gate.

Disadvantages of the logic gate of FIG. 1 include the use of several NMOS and PMOS transistors, which generally require a larger surface area. Typically, an increase in the surface area has a corresponding increase in cost. Connection of both NMOS and PMOS transistors may also hinder the switching speed. If, for example, the input terminals A, B, and C were designated as being in the logically "low" state and then changed to the logically "high" state, the PMOS transistors 100, 102, 104 would be turning "off" while the NMOS transistors 120, 122, 124 are turning "on." Generally, it takes longer for the PMOS transistors to turn "off" than it does for the NMOS transistors to turn "on." Thus, there is a period when both the PMOS and the NMOS transistors 100, 102, 104, 120, 122, 124 may be "on," which can delay the output node 110 from achieving the desired state (e.g., a logically "low" state). Also, with all of the transistors 100, 102, 104, 120, 122, 124 turned "on," current flows from $V_{ref}$ to ground, increasing the power consumed by the static CMOS logic gate.

In this example, the NMOS transistors 120, 122, 124 operate to apply a logically low voltage level at the output node 110, while the PMOS transistors 100, 102, 104 operate to apply a logically high voltage level at the output node 110. Thus, there is a type of "fighting" that may occur between the PMOS transistors 100, 102, 104 and the NMOS transistors 120, 122, 124. In this case, the output node 110 will not fully discharge (i.e., to go to a logically low voltage level) until after all of the PMOS transistors 100, 102, 104 turn "off." This causes a delay between the time the input terminals A, B, and C change and the time the output node 110 reflects the change. This delay results in a decreased switching speed.

Figure 2A:
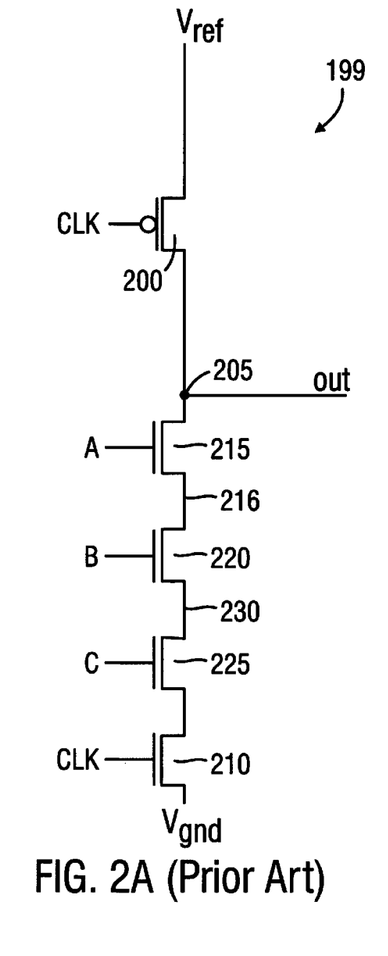
FIGS. 2A and 2B are circuit diagrams for a conventional domino logic circuit.

FIG. 2A illustrates a conventional, ideal domino logic gate 199, which includes one PMOS transistor 200 and several NMOS transistors 210, 215, 220, 225 serially connected together. A master common clock signal is applied to the enable input terminal of the PMOS transistor 200. When the clock signal is "low" (i.e., has a logically low voltage level), the transistor 200 turns "on," applying a logically high voltage level to an output node 205. The same clock signal is applied to the NMOS transistor 210, which causes the transistor 210 to remain off during the same period. Enabling the PMOS transistor 200 (i.e., turning the PMOS transistor "on"), and disabling the NMOS transistor 210 causes the output node 205 to be in a logically "high" state. Varying the voltage applied to the enable input terminals A, B, and C of the NMOS transistors 215, 220, 225 can cause the output node 205 to discharge (i.e., go to a logically "low" state). For example, if the input terminals A, B, and C are all at a logically high voltage level while the clock signal is at a logically high voltage level, such that all of the NMOS transistors 210, 215, 220, 225 are turned "on," then the output node 205 will discharge. The logic gate 199 shown in FIG. 2A is configured to implement a logical NAND gate.

Problems with the circuit of FIG. 2A include charge-sharing, which can cause an incorrect state at the output node 205. For example, if the input terminal A and input terminal B are "high," the transistors 215 and 220 would be "on." Thus, some of the charge present at the output node 205 can be redistributed to intermediate nodes 216 and 230. The charge shift to the intermediate nodes 216 and 230 can cause the voltage level present at the output node 205 to drop substantially, causing the logically high voltage level to be seen as a logically low voltage level. This can cause the logic gate 199 to function improperly.

Figure 2B:
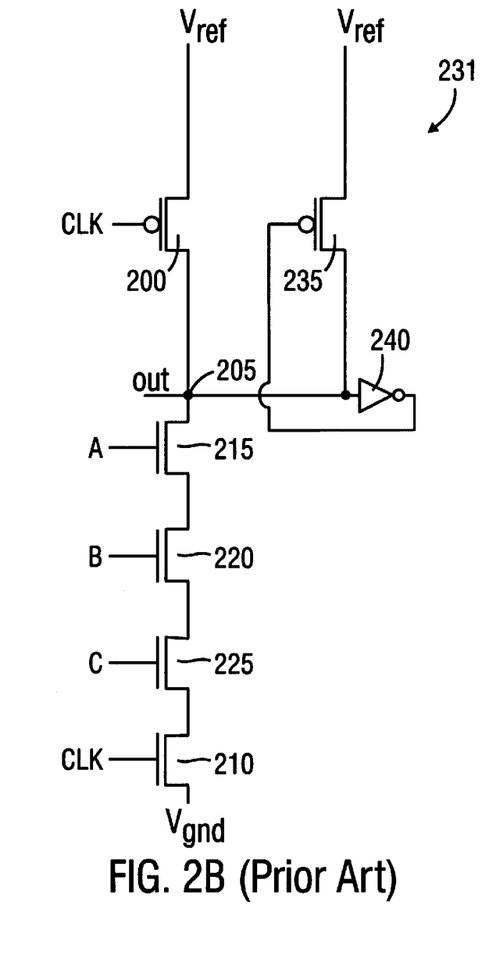

FIG. 2B illustrates a modified domino logic gate 231, which includes an additional PMOS transistor 235 and an inverter 240. The enable input terminal of the PMOS transistor 235 is connected to the output terminal of the inverter 240. When the voltage level of the clock is "low," the output node 205 is at a logically high voltage level, which causes the output terminal of the inverter 240 to be at a logically low voltage level. The logically low voltage level from the inverter 240 is applied to the enable input terminal of the PMOS transistor 235, which causes that transistor 235 to turn "on." When the transistor 235 is "on," it helps to maintain a high voltage level at the output node 205. The logic gate 231 shown in FIG. 2B is configured to implement a logical NAND gate.

If the input terminals A, B, and C have a high voltage level applied, the NMOS transistors 215, 220, 225 apply a logically low voltage to the output node 205, while the PMOS transistor 235 applies a logically high voltage. The output node 205 cannot fully discharge until the PMOS transistor 235 turns "off," which causes a delay and limits the switching speed of the logic gate 231. In addition, during this period where both the PMOS and NMOS transistors 235, 215, 220, 225, 210 are "on," wasted current flows from $V_{ref}$ to ground. Moreover, the logic gate 231 of FIG. 2B still has a similar potential for charge-sharing as described in conjunction with the logic gate 199 of FIG. 2A.

Figure 3:
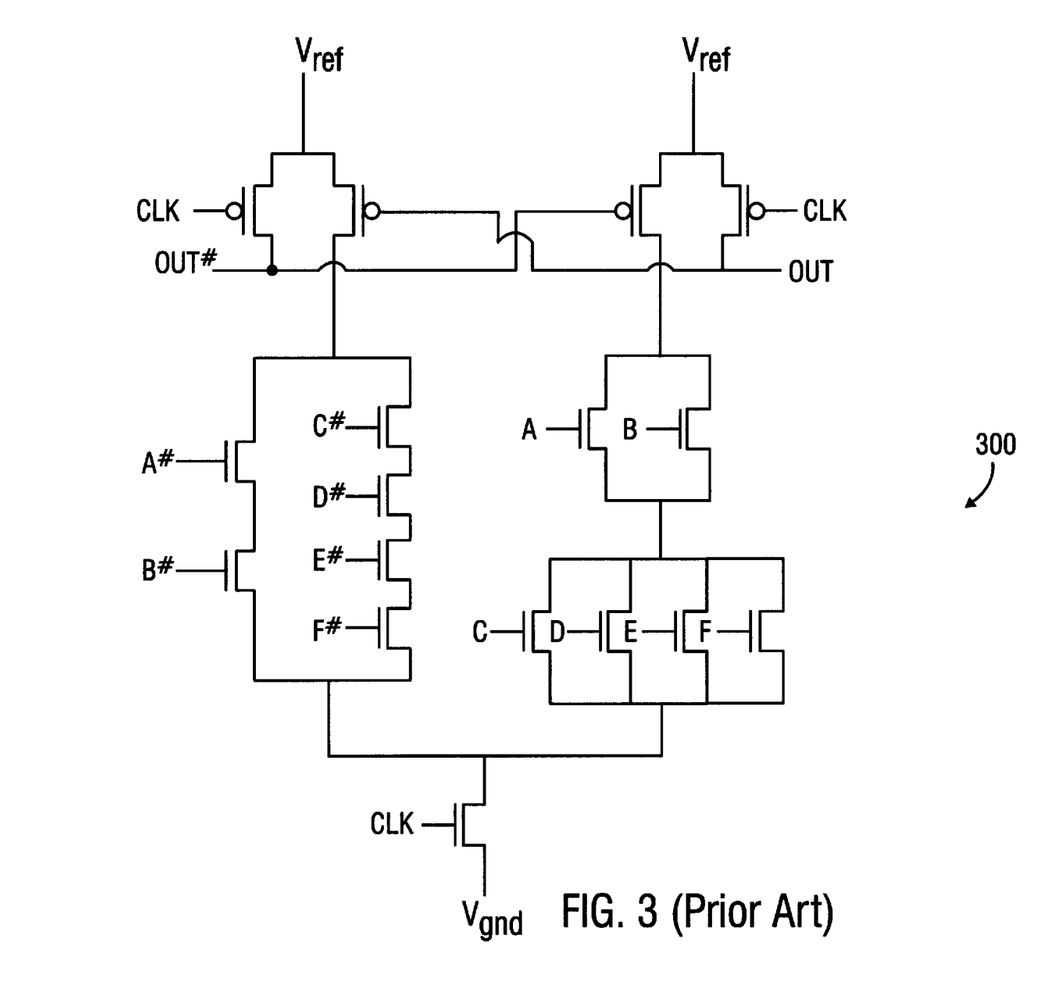
FIG. 3 is a circuit diagram for a conventional CVSL logic circuit.

FIG. 3 shows a conventional Cascode Voltage Switch Logic (CVSL) gate 300, which may function similarly to two domino gates. One side of the gate 300 charges while the other side of the gate 300 discharges. CVSL is known in the art as a dual-rail structure. This type of structure employs an inverted input terminal for each input terminal. Thus, in FIG. 3 input terminals A–F have corresponding inverted input terminals $A^\#$–$F^\#$. Generally, a dual-rail structure employs a larger area and more power. In addition, CVSL may also have "fighting" during the discharge cycle, which can cause the switching speed to be limited. If sense amplifiers are placed on both out and $out^\#$ nodes to achieve more sensitive detection, noise present at either the out or $out^\#$ nodes will also be amplified, which can cause the gate to malfunction. Thus, it would be beneficial to have a differential precharge circuit that is capable of overcoming the shortcomings of conventional structures and methods.

SUMMARY OF THE INVENTION

The invention relates in general to logic devices, and more particularly to a fast-switching differential precharge circuit. The invention includes a precharging device for placing a first or a second node in a first desired state by providing a connection between that node and a first voltage supply. A second precharging device is also included, which places a second node in a second desired state, which is the logical inverse of the first desired state. Each precharging device includes a state maintaining device and a resetting device. The invention also includes first and second logical networks that are connected to both the first and second nodes and help to maintain the state of a given node.

A method for differentially precharging a circuit in accordance with the invention includes applying a first state to a first node and applying a second state to a second node, such that the second state is the logical inverse of the first state. The second state on the second node is maintained, while a logic device coupled to the first node is reset. This enables the first node to be quickly charged to the second state and maintained in that state during the next input data transition, if so dictated.

BRIEF DESCRIPTION OF THE DRAWINGS

Other objects and advantages of the invention will become apparent upon reading the following detailed description and upon reference to the drawings in which.

While the invention is susceptible to various modifications and alternative forms, specific embodiments have been shown by way of example in the drawings and are described in detail. It should be understood, however, that the description herein of specific embodiments is not intended to limit the invention to the particular forms disclosed. On the contrary, the intention is to cover all modifications, equivalents, and alternatives falling within the spirit and scope of the invention as defined by the appended claims.

DETAILED DESCRIPTION OF SPECIFIC EMBODIMENTS

Illustrative embodiments of the invention are described below as they might be employed in a differential-precharge circuit. In the interest of conciseness, not all features of an actual implementation are described in this specification. It will of course be appreciated that in the development of any actual embodiment, numerous implementation-specific decisions must be made to achieve the developer's specific goals, such as compliance with system-related and business-related constraints. Moreover, it will be appreciated that even if such a development effort might be complex and time-consuming, it would nevertheless be a routine undertaking for one of ordinary skill having the benefit of this disclosure.

Overview

Figure 4:
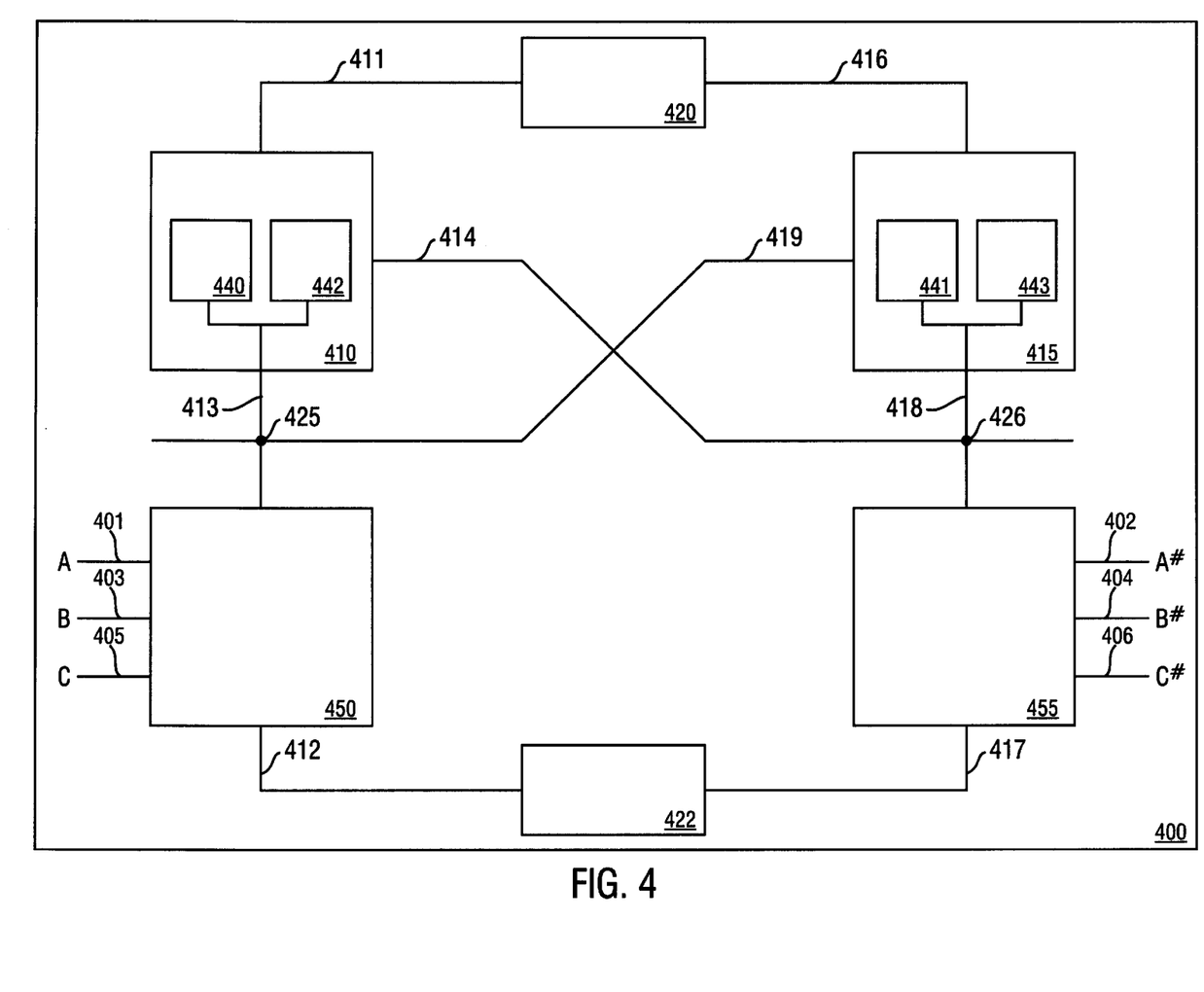
FIG. 4 is a simplified circuit diagram of a differential precharge circuit in accordance with this invention.

FIG. 4 is a simplified circuit diagram of a differential precharge circuit 400 in accordance with the present invention. A differential circuit, as defined in this application, is a circuit that has both input terminals and the logical inverse of the input terminals in the circuit. For example, the input terminals 401, 403, 405 are labeled A, B, and C, respectively. The logical inverse input terminals (later referred to as the inverse input terminals) 402, 404, 406 are labeled $A^\#$, $B^\#$, and $C^\#$, respectively. The data signals applied to the inverse input terminals 402, 404, 406 may be the same or different from each other, as dictated by the input signals. For example, if the input signal on the input terminal 401 is logically "high," the inverse input signal on the inverse input terminal 402 is logically "low."

The input terminals 401, 403, 405 and the inverse input terminals 402, 404, 406 are coupled to the logical networks 450, 455. The precharging devices 410, 415 are adapted to be coupled to a first voltage supply 420 by the lines 411, 416, while the logical networks 450, 455 are coupled to a second voltage supply 422 by the line 412, 417. The first voltage supply 420 may generate a voltage equivalent to a specified power supply voltage (e.g., $V_{cc}$), while the second voltage supply 422 may generate a voltage equivalent to a specified ground voltage (e.g., $V_{ss}$).

A "pull-down" logic network 450 is connected to the input terminals 401, 403, 405 and the node 425. The "pull-down" network 450 is connected to the voltage source 422 by the line 412. The logic within the "pull-down" network 450 allows current to flow from the node 425 to the voltage source 422 placing a voltage approximately equal to the voltage $V_{ss}$ at the node 425. The logic within the "pull-down" network 450 is governed largely by the input signals on the input terminals 401, 403, 405. The inverse input terminals 402, 404, 406 are coupled to a "pulldown" network 455 that is the logical inverse of the "pull-down" network 450. One skilled in the art will appreciate that the logically inverse "pull-down" network 455 may be structurally similar even though it is logically inverted (e.g., logically inverted networks for a multiplexer).

The logical networks 450, 455 receive the input and inverse input signals and generate output signals at the node 425, 426. The output signals cause the state of the node to transition. The precharging device 410 is coupled to the node 425 by a line 413 and the node 426 by a line 414. Similarly, the precharging device 415 is coupled to the node 426 by a line 418 and the node 425 by a line 419. The logic within the differential precharge circuit 400 are designed such that the nodes 425 and 426 are logical inverses of each other.

When the output signals have been applied to the nodes 425, 426, state maintaining devices 440, 441 within the precharging devices 410, 415 may be used to maintain the logic level of a given node. The state maintaining device 440, 441 are designed such that they require less power and current when active. When the state maintaining devices 440, 441 n are inactive and the logical networks 450, 455 are active, the resetting devices 442, 443 may be used to prepare the precharging devices 410, 415 for the next state transition. For example, if the logical network 450 is actively pulling the state of the node 425 to a logically low level, the resetting device 442 would cause the precharging device 410 to get ready to pull the node to a logically high level. Thus, use of the state maintaining devices 442, 443 can reduce the power requirements of the circuit 400. The output signals at the nodes 425 and 426 may be sent to other logical circuits as desired.

The logic within the precharging devices 410, 415 and the logical networks 450, 455 allows the generation of proper output signals and the maintenance of the proper state without contention. The logic circuit 400 enables at least one of the nodes (e.g., 425) to be precharged to a particular state before a state transition. Thus, the differential logic circuit 400 receives logically inverse input signals and generates corresponding logically inverse output signals in a quick and efficient manner in which precharging and resetting may be performed with minimal power requirements and essentially no contention.

A First Embodiment

Figure 5A:
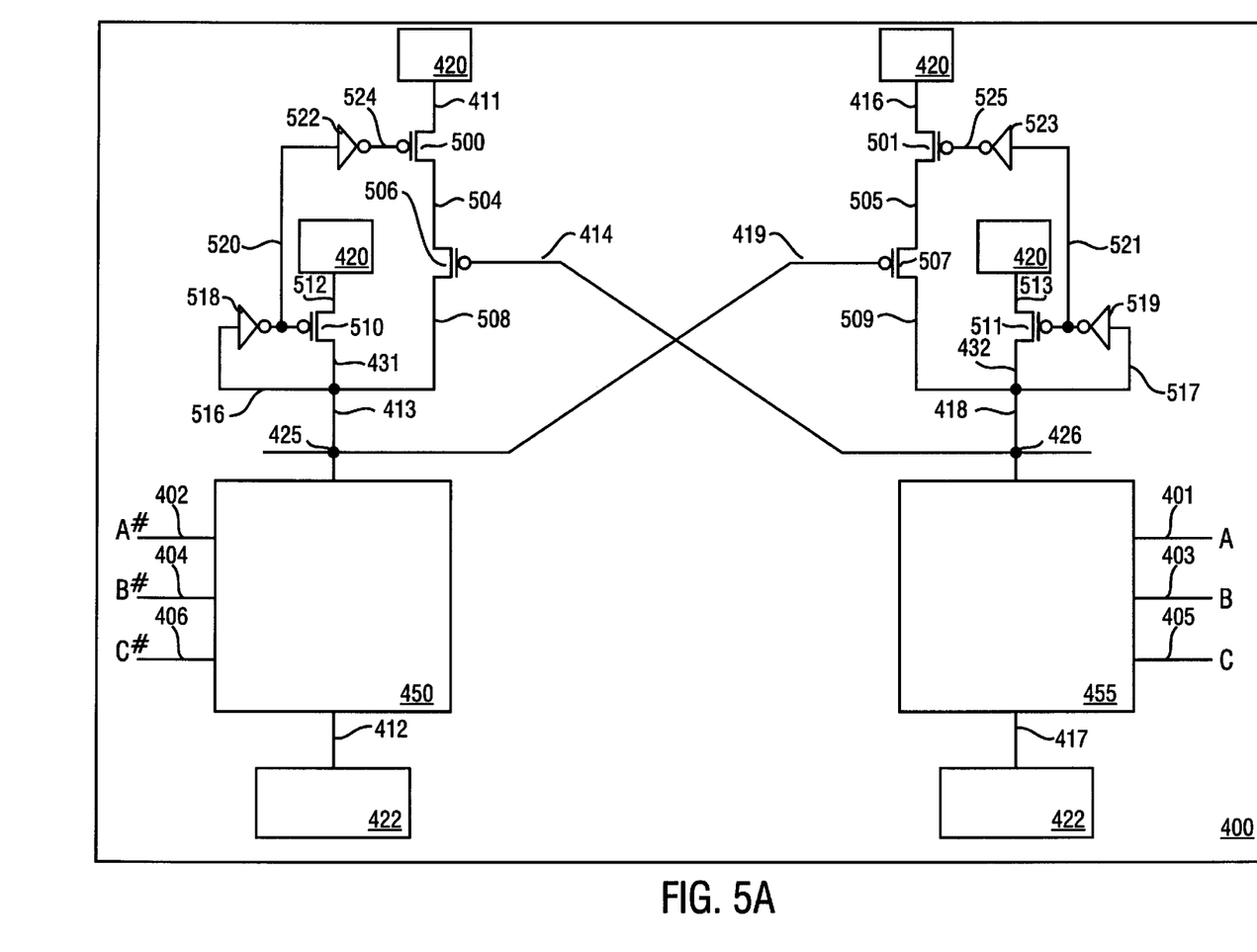
FIGS. 5A and 5B are circuit diagrams for a first embodiment of this invention.

FIG. 5A illustrates a first embodiment of the differential precharge circuit 400 with input and inverse input terminals 401–406. The circuit 400 includes six PMOS transistors 500, 501, 506, 507, 510, 511. As would be known by one skilled in the art, the PMOS transistors 500–511 can be replaced by bipolar junction transistors (BJTs), field effect transistors (FETs), or any other transistor topology that allows for complementary transistors. As previously mentioned, PMOS transistors are turned "on" when a logically low voltage level is applied to the gate of the transistor. When a given MOS transistor is "on" current flows between the source and the drain of the transistor, enabling a drain voltage to be approximately equal to a source voltage.

For example, the transistor 500 has a source coupled to the voltage supply 420 by the line 411. When the signal on the line 524 is "low," current flows from the voltage supply 420 through the transistor 500 to the drain terminal 504. If the voltage from the voltage supply 420 is $V_{cc}$, the voltage present on the drain terminal 504 is approximately equal to $V_{cc}$, and the line would be designated as being in a logically "high" state. The drain terminal 504 of the transistor 500 is coupled to the source terminal of the transistor 506. When the transistor 506 is "on" while the transistor 500 is "on," current can flow from the voltage supply 420 to the node 425. In this case, the voltage level at the node 425 would be designated as a logically "high" state.

While the transistors 500, 506 can be used to place the node 425 in a logically "high" state, the transistor 510 can be used to help maintain the state of the node 425. The transistor 510 has a source coupled to the voltage supply 420 by the line 512 and a drain coupled to the node 425 by the line 431. The size and configuration of the transistors 500, 506 are designed such that when both are "on," the node 425 is quickly charged to a logically "high" state. In contrast, when the smaller transistor 510 is "on," less current is generated, yet it is sufficient to maintain the state of the node 425 (i.e., keep the node in a logically "high" state by providing a constant connection to the power supply 420).

If the node 425 is initially in a logically "high" state, the input terminal 516 to the inverter 518 will be in a logically "high" state, while the output terminal 520 will be in a logically "low" state. The logically "low" state on the output terminal 520 places a logically "low" state at the gate of the transistor 510, which turns the transistor 510 "on." Similarly, the logically "low" state on the output terminal 520 is also coupled to the input terminal of the inverter 522. A logically "low" state at the input terminal to the inverter 522 generates a logically "high" state at the output terminal 524. The logically "high" state at the output terminal 524 turns the transistor 500 "off." Thus, the transistor pair 500, 506 would not be "on" for an extended period while the transistor 510 is "on." That is, the inverters 518, 522 act as a feedback mechanism to turn "off" the transistor 500 once the node 425 is charged to a logically "high" state.

The transistors 501, 507, 511 and the inverters 519, 523 are configured substantially similarly to the transistors 500, 506, 510 and the inverters 518, 522. The difference in configuration is that the transistors 507, 511 and the inverter 519 are coupled to the node 426. The transistors 506, 507 are also cross-coupled to the nodes 426, 425 by the lines 414, 419, respectively. The cross-coupling configuration allows the values of the nodes 425, 426 to determine whether the corresponding cross-coupled transistor (i.e., transistors 507, 508, respectively) will be "on." For example, if the state at the node 425 is "high," the state at the node 426 should be "low" since it is the logical inverse. Consequently, the transistor 507 is turned "off" to keep the node 426 from charging to a logically "high" state, while the transistor 506 is turned "on."

If the node 426 is "low" before the node 425 goes "low," the transistor 501 would be "on," the transistors 507, 511 would be "off," and the "pull-down" network 450 would keep the node 426 "low." However if the inverse "pull-down" network 455 pulled the node 425 "low," the transistor 507 would quickly turn "on" while the transistor 501 is "on." Thus, the node 426 would quickly charge to a logically "high" state, which would turn "off" the transistor 506.

Figure 5B:
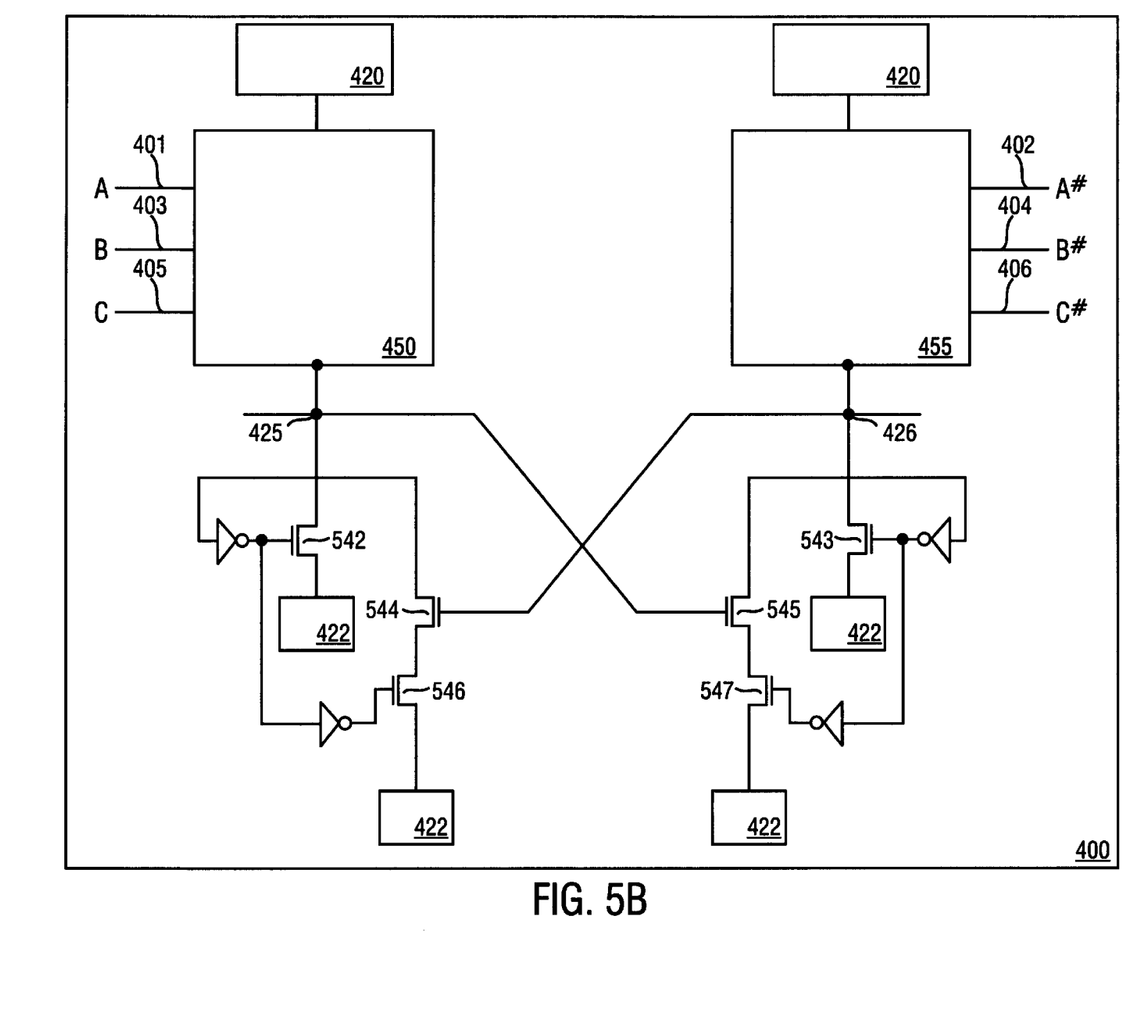

The transistors 510 and 501 would also turn "off" after some delay. If the inverse "pull-down" network 455 places a logically "low" state on the node 425, the "pull-down" network 455 does not place a logically "low" state on the node 426 since they are logical inverses. In this case the transistor 511 is maintaining the state of the node 426 at a logically "high" state, and the other transistors are ready for the next transition of the nodes 425, 426. The circuit shown in FIG. 5A precharges a node "high," while the circuit of FIG. 5B, which is substantially similar, precharges a node to a logically "low" state using the NMOS transistors 542–547 and the "pull-up" logic networks 540, 541.

A Second Embodiment

Figure 6A:
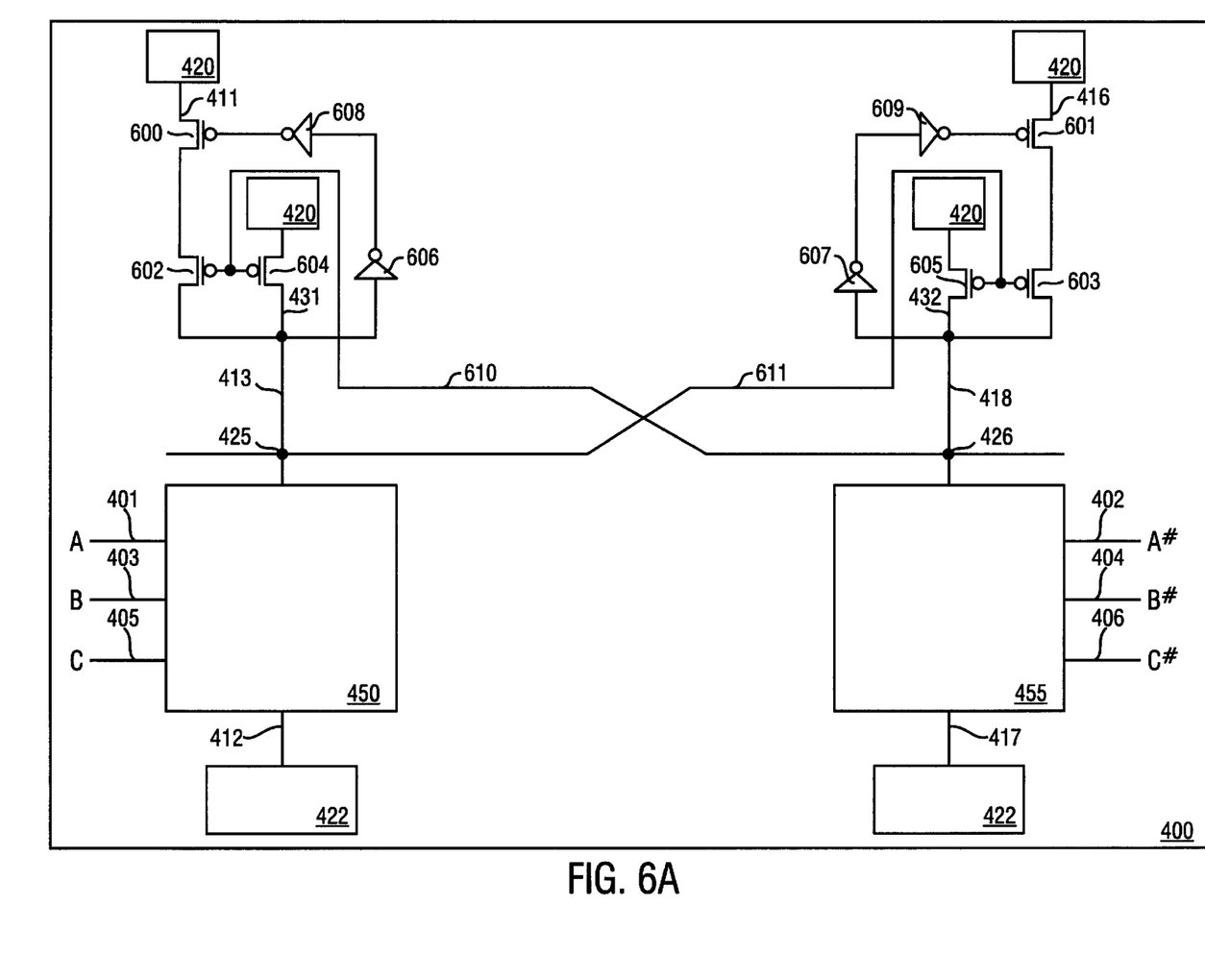
FIGS. 6A and 6B are circuit diagrams for a second embodiment of this invention.

FIG. 6A is a circuit diagram of a second embodiment of the logic circuit 400. The PMOS transistors 600–605 are configured similarly to the circuit of FIG. 5A. The difference is that the gates of the transistors 604, 605 are cross-coupled to the nodes 425, 426 by the lines 610, 611, respectively. The size and configuration of the transistors 602, 604; 603, 605 are designed such that when both are "on," the node 425 is quickly charged to a logically "high" state. In contrast, when the smaller transistor 604 is "on," less current is generated, yet it is sufficient to maintain the state of the node 425 (i.e., keep the node in a logically "high" state by providing a constant connection to the power supply 420). If the node 425 goes to a logically "low" state because the pull down network 450 is operational, the transistors 605, 603 turn "on." In this case, the node 426 was previously in a logically "low" state, which caused the transistor 601 to be "on." Presently, the node 426 is going to a logically "high" state, which would cause the transistor 601 to turn "off" after some time delay.

Figure 6B:
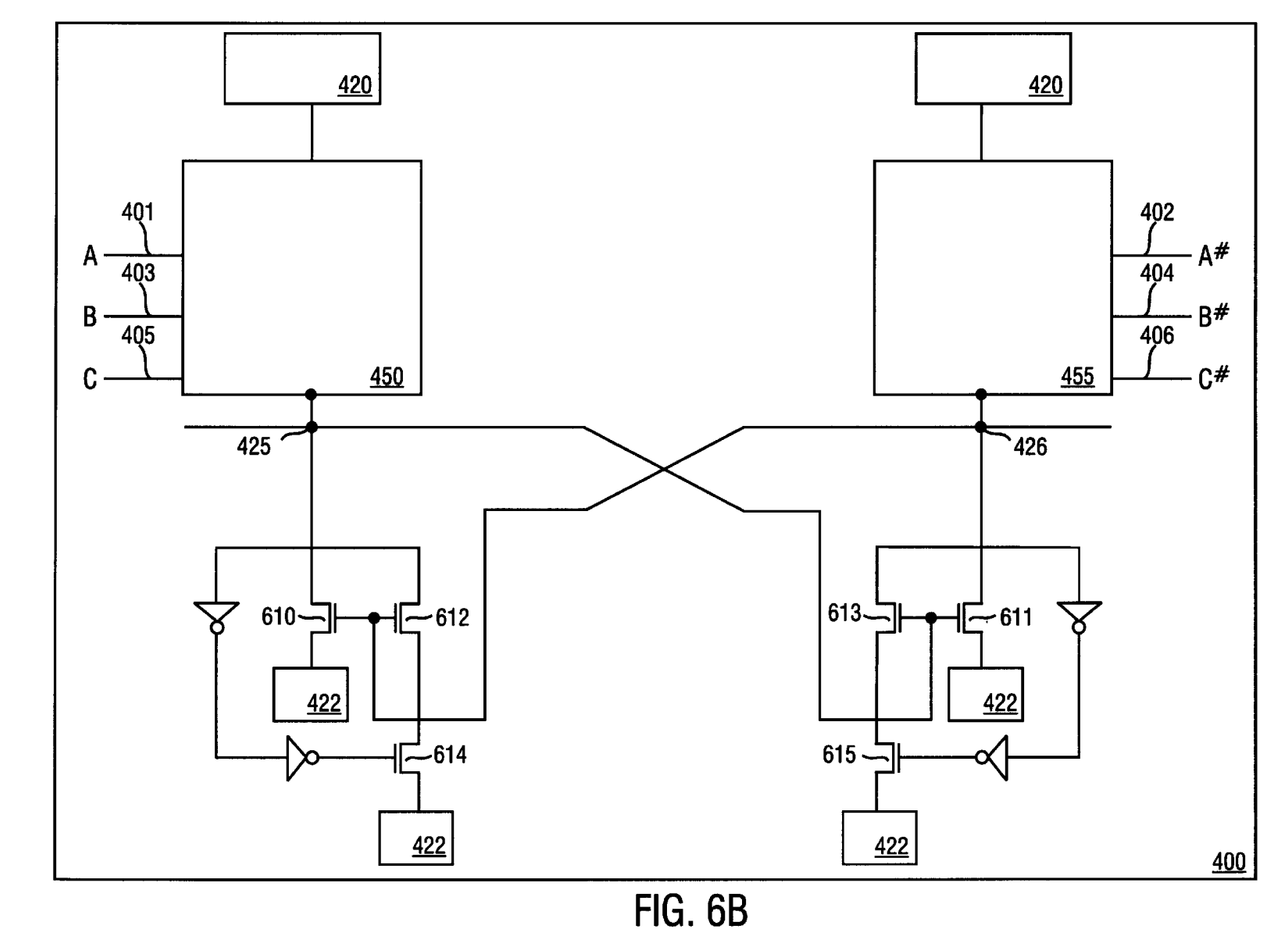

Thus, there would be a period of time in which the transistors 601, 603, 605 would all be "on" at the same time. This causes the node 426 to be pulled to a logically "high" state quickly. The logically "high" state at the node 426 turns the transistors 602, 604 "off," which would essentially prevent any contention from occurring. The logically "low" state at the node 425 also turns the transistor 600 "on." During the next transition, the transistor 600, along with the transistors 602, 604, would pull the node 425 "high" when the node 426 goes "low." FIG. 6B illustrates an embodiment of the circuit 400 in which the nodes 425, 426 are differentially precharged "low" with the transistors 610–615.

A Third Embodiment

Figure 7A:
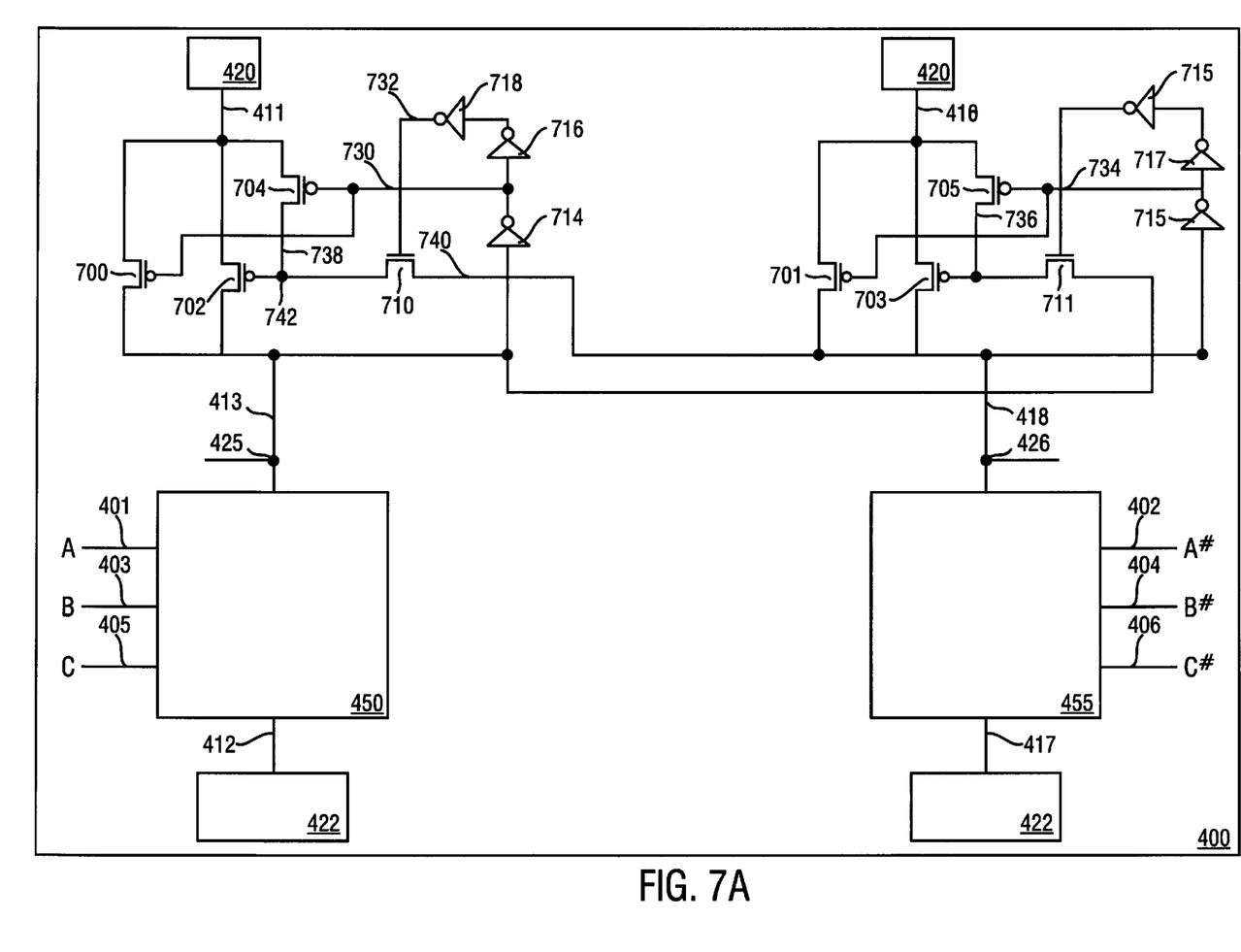
FIGS. 7A and 7B are circuit diagrams for a third embodiment of this invention.

FIG. 7A illustrates a third embodiment for the differential precharge circuit 400 with PMOS transistors 700–705, inverters 714–718, and NMOS transistors 710, 711. If the initial state of the node 425 is "low," the node 426 is "high." One skilled in the art will appreciate that an initial state with node 425 in a logically "high" state and node 426 in a logically "low" state is also possible.

The logically "low" state on the node 425 generates a logically "high" state at the output terminal 730 of the inverter 714 and turns "off" the transistors 700, 704. The logically "high" state on an output terminal 732 of the inverter 718 turns the transistor 710 "on." Similarly, the logically "high" state on the node 426 generates a logically "low" state at an output terminal 734 of the inverter 715, which turns the transistors 701, 705 "on." A logically "high" state at an output of the inverter 719 turns the transistor 711 "off." The transistor 703 has a gate coupled to the drain of the transistor 705 by a line 736. Since the transistor 705 is "on," a logically "high" state is applied to the line 736, which turns the transistor 703 "off." The gate of the transistor 704 is connected to the drain of the transistor 704 by a line 738. The logically "high" state on the node 426 causes a logically "high" state to be applied to a line 740, which causes a logically "high" state to be at the node 742, thereby turning the transistor 702 "off."

Figure 7B:
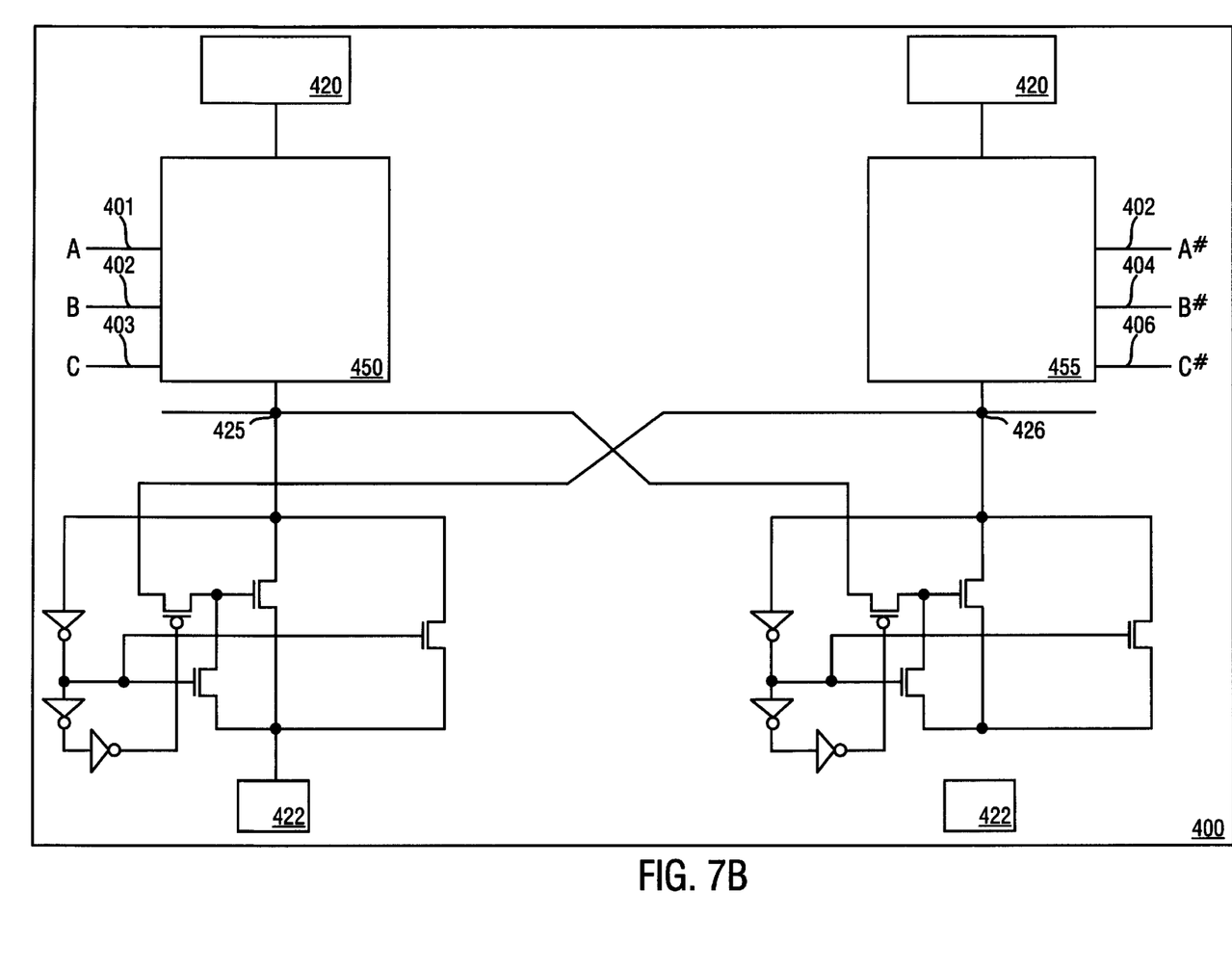
Figure 8:
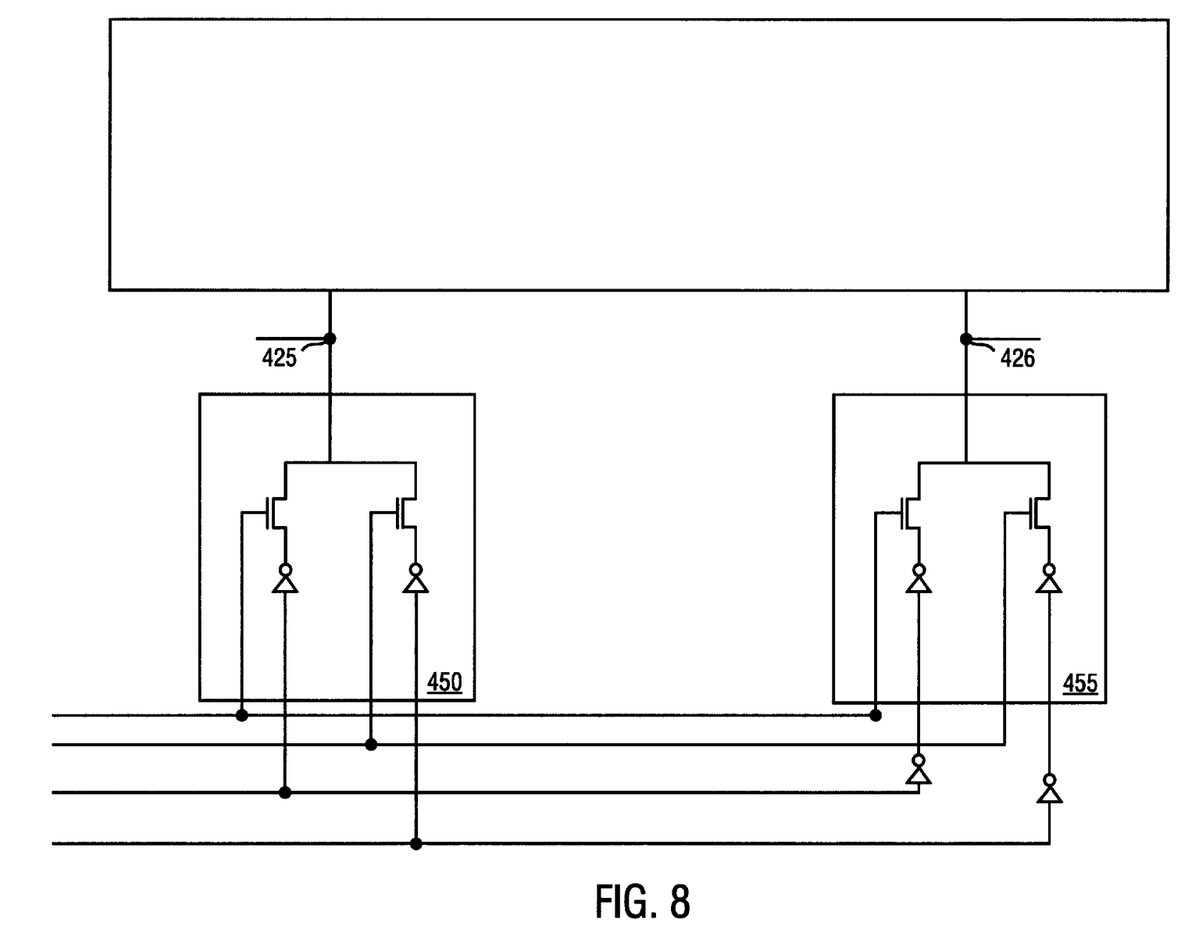
FIG. 8 is an embodiment of a pull-down network to be used with a differential precharge circuit in accordance with this invention.

If the pull-down circuit 455 pulls the node 426 to a logically "low" state, a logically is "low" state is applied to the line 740, turning the transistor 702 "on," which pulls the node 425 to a logically "high" state. After a brief delay, the transistors 700, 704 turn "on," and the transistor 702 turns "off." The transistor 700 helps to maintain the node 425 in a logically "high" state. The logically "low" state at the node 426 causes the transistors 701, 705 to turn "off" and the transistor 711 to turn "on." Since the transistor 711 is "on," a logically "high" state is applied to the line 736, which holds the transistor 703 "off." The circuit in FIG. 7A differentially precharges the circuit to a logically "high" state, while the circuit in FIG. 7B is configured similarly, but differentially precharges the circuit to a logically "low" state. FIG. 8 illustrates a possible configuration for the pull-down networks 450, 455 which can be used in any of the three embodiments.

A device in accordance with the invention offers several advantages, including a faster switching speed as a result of having a state maintaining mechanism separate from the state generating mechanisms. The precharging of one of the reference nodes 425 and 426 and the output node also enhances switching speed by employing only one action (i.e., a charge or a discharge) to be performed. In addition, the use of two serial transistors (e.g., the transistors 500, 504) connected between the output node 425 and either the ground voltage in a precharge "low" or a reference voltage in a precharge "high" $V_{ref}$ also enhances speed. A reduced number of gate delays per circuit occurs since the present invention enables the implementation of fast, complex gates. The gate input circuits of the present invention may be any type or complexity without affecting the complexity and the switching speed of the basic circuit. The simple state nature of the invention allows for a reduced maintenance current and power consumption in comparison with conventional logic gates. The testing of a logic device in accordance with the invention is no more difficult than that of some conventional circuits (e.g., domino), since the logic device is very likely to settle in the correct state. The faster switching speed allows more aggressive voltage scaling. A lower voltage supply would employ considerably less power, which may further reduce cost.

It will be appreciated by those of ordinary skill in the art having the benefit of this disclosure that numerous variations from the foregoing illustration will be possible without departing from the inventive concept described herein. Accordingly, it is the claims set forth below, and not merely the foregoing illustration, which are intended to define the exclusive rights of the invention.

What is claimed is:

1. A differential precharge circuit, comprising:
   a precharging device coupled between a voltage supply, a first node, and a second node to charge one of the first and second nodes to a first logic state, each node cross-coupled to the other node for enabling of the precharging device;
   a resetting device coupled to disable the precharging device from continuing to charge the one node once the one node is in the first logic state;
   a charge maintaining device coupled between the voltage supply and the nodes to maintain the charge on the one node charged to the first logic state, but in which a charge current for maintaining the charge on the one node is less than a charge current of the precharging device, the charge maintaining device being enabled by the one node for which it maintains the charge; and
   first and second logic networks respectively coupled to the first and second nodes to determine alternative logic states for the two nodes based on an input and its complement input to the two logic networks.

2. The differential precharge circuit of claim 1 wherein the precharging device includes a first transistor coupled to the voltage supply and the first node, and having its enable input coupled to the second node, a second transistor coupled to the voltage supply and the second node, and having its gate coupled to the first node, the first and second transistors being arranged for alternate operation.

3. The differential precharge circuit of claim 2 wherein the resetting device includes third and fourth transistors, respectively coupled between the voltage supply and the first transistor and the voltage supply and the second transistor, the third and fourth transistors being arranged for alternate operation.

4. The differential precharge circuit of claim 3 wherein the charge maintaining device includes fifth and sixth transistors, respectively coupled between the voltage supply and the first node and the voltage supply and the second node, the fifth and sixth transistors having their gates coupled to the first and second nodes, respectively, and being arranged for alternate operation.

5. The differential precharge circuit of claim 4 wherein the first transistor is substantially larger than the fifth transistor and the second transistor is substantially larger than the sixth transistor.

6. The differential precharge circuit of claim 4 wherein the first, second, third, fourth, fifth and sixth transistors are selected from the group of transistors consisting of BJTs, FETs, and MOS transistors.

7. The differential precharge circuit of claim 4 wherein the first and second transistors are PMOS transistors.

8. A differential precharge circuit, comprising:
a first precharging device coupled between a voltage supply and a first node and being controllable by an enable input coupled to a second node, the first precharging device for charging the first node to a first logic state;
a first resetting device coupled to disable the first precharging device from continuing to charge the first node once the first node is in the first logic state;
a first charge maintaining device coupled between the voltage supply and the first node to maintain the charge on the first node to the first logic state, but in which a charge current for maintaining the charge on the first node is less than a charge current of the first precharging device, the first charge maintaining device being enabled by its enable input coupled to the first node,
a second precharging device coupled between the voltage supply and the second node and being controllable by an enable input coupled to the first node, the second precharging device for charging the second node to a first logic state;
a second resetting device coupled to disable the second precharging device from continuing to charge the second node once the first node is in the first logic state;
a second charge maintaining device coupled between the voltage supply and the second node to maintain the charge on the second node to the first logic state, but in which a charge current for maintaining the charge on the second node is less than a charge current of the second precharging device, the second charge maintaining device being enabled by its enable input coupled to the second node; and
first and second logic networks respectively coupled to the first and second nodes to determine alternative logic states for the two nodes based on an input and its complement input to the two logic networks.

9. The differential precharge circuit of claim 8 wherein the first precharging device includes a first transistor coupled to the voltage supply and the first node, and the second precharging device includes a second transistor coupled to the voltage supply and the second node, the first and second transistors being arranged for alternate operation.

10. The differential precharge circuit of claim 9 wherein the first and second resetting devices include third and fourth transistors respectively, the third transistor coupled between the voltage supply and the first transistor and the fourth transistor coupled between the voltage supply and the second transistor, the resetting devices being arranged for alternate operation.

11. The differential precharge circuit of claim 10 wherein the first and second charge maintaining devices include fifth and sixth transistors respectively, the fifth transistor coupled between the voltage supply and the first node and the sixth transistor coupled between the voltage supply and the second node, the fifth and sixth transistors having their gate terminals coupled to the first and second nodes.

12. The differential precharge circuit of claim 11 wherein the first, second, third, fourth, fifth, and sixth transistors are PMOS transistors.

13. The differential precharge circuit of claim 11 wherein the first transistor is substantially larger than the fifth transistor and the second transistor is substantially larger than the sixth transistor.

14. The differential precharge circuit of claim 11 wherein the transistors are selected from the group of transistors consisting of BJTs, FETs, and MOS transistors.

15. A method for differentially precharging a circuit, comprising:
precharging a first node to a first logic state by applying a first precharge current;
resetting the precharging to terminate the first precharge current to the first node;
maintaining a charge on the first node by having the first node enable a first weaker charge current that is weaker than the first precharge current to sustain the first logic state at the first node;
performing the precharging, resetting and maintaining the charge on a complement side of a differential circuit, the complement side having a second node in which the first and second nodes are cross-coupled to provide enable signals to precharge opposite sides of the differential circuit, the second node being precharged by a second precharge current and the second node enabling a second weaker charge current that is weaker than the second precharge current to sustain the first logic state at the second node.

16. The method of claim 15 further comprising isolating the logic states on the first and second nodes.

17. A differential precharge circuit comprising:
a first transistor coupled between a first voltage supply and the first node, and having an enable input terminal coupled to a second node;
a second transistor coupled between the voltage supply and the second node, and having an enable terminal coupled to the first node;
first and second logic networks to place the first or second node in a second logic state, the first logic network being coupled between a voltage supply return and the first node, and the second logic network being coupled between the voltage supply return and the second node, the second logic network being the logical complement of the first logic network;
a third transistor coupled between the first transistor and the voltage supply, said third transistor having an enable terminal coupled to the first node;

a fourth transistor coupled between the second transistor and the voltage supply, said fourth transistor having an enable terminal coupled to the second node;

a fifth transistor coupled between the voltage supply and the first node, said fifth transistor having an enable terminal coupled to the first node; and a sixth transistor coupled between the voltage supply and the second node, the sixth transistor having an enable terminal coupled to the second node.

18. The differential precharge circuit of claim 17 wherein the transistors are selected from the group of transistors consisting of BJTs, FETs and MOS transistors and the logic networks include at least one transistor.

19. The differential precharge circuit of claim 17 wherein the logic networks include pass gate transistors.

20. The differential precharge circuit of claim 17 wherein the first transistor is substantially larger than the fifth transistor and the second transistor is substantially larger than the sixth transistor.

21. A differential precharge circuit comprising:

a first transistor coupled between a first node and a voltage supply, the first transistor having its gate coupled to a second node;

a second transistor coupled between the second node and the voltage supply, the second transistor having its gate coupled to the first node;

first and second logic networks to place the first and second nodes in alternative logic states, the first logic network being coupled to the first node and the second logic network being coupled to the second node;

a third transistor coupled between the first transistor and the voltage supply, said third transistor having its gate coupled to the first node;

a fourth transistor coupled between the second transistor and the voltage supply, said fourth transistor having its gate coupled to the second node;

a fifth transistor coupled between the voltage supply and the first node, the fifth transistor having its gate coupled to the first node, the fifth transistor for maintaining a charge on the first node, but in which a charge current for maintaining the charge on the first node is less than a charge current of the first transistor; and a sixth transistor coupled between the voltage supply and the second node, the second transistor having its gate coupled to the second node, the sixth transistor for maintaining a charge on the second node, but in which a charge current for maintaining the charge on the second node is less than a charge current of the second transistor.

22. The differential precharge circuit of claim 21 wherein the transistors are selected from the group of transistors consisting of BJTs, FETs, and MOS transistors.

23. The differential precharge circuit of claim 21 wherein the logic networks include pass gate transistors.

24. The differential precharge circuit of claim 21 wherein the first transistor is substantially larger than the fifth transistor and the second transistor is substantially larger than the sixth transistor.

25. A method for differentially precharging a circuit, comprising:

coupling a first node to voltage supply corresponding to a first logic state and by having an enable line cross-coupled to a second node of a differential circuit to charge the first node to obtain the first logic state;

disconnecting the first node from the voltage supply by disabling the precharge of the first node;

maintaining a charge on the first node by applying a weaker charge current, which is less than a precharge current applied during precharging, by having the first logic state of the first node enable the weaker charge current.

* * * * *

UNITED STATES PATENT AND TRADEMARK OFFICE
CERTIFICATE OF CORRECTION

PATENT NO.   : 6,046,608
DATED        : April 4, 2000
INVENTOR(S)  : Theogarajan It is certified that error appears in the above-identified patent and that said Letters Patent is hereby corrected as shown below:

In column 9, at line 45, after "node" delete "," and insert --;--.

In column 12, at line 25, insert "a" after "coupling a first node to".

Signed and Sealed this

Fifteenth Day of May, 2001

Attest:

NICHOLAS P. GODICI

*Attesting Officer*    Acting Director of the United States Patent and Trademark Office